United States Patent [19]

Ando et al.

[11] Patent Number: 4,828,870

[45] Date of Patent: May 9, 1989

[54] METHOD OF FORMING A THIN ALUMINUM FILM

[75] Inventors: Yasunori Ando; Kiyoshi Ogata, both of Kyoto, Japan

[73] Assignee: Nissin Electric Co., Ltd., Kyoto, Japan

[21] Appl. No.: 126,014

[22] Filed: Nov. 27, 1987

[30] Foreign Application Priority Data

Nov. 27, 1986 [JP] Japan .................. 61-283808

[51] Int. Cl.$^4$ ................................. B05D 3/06
[52] U.S. Cl. .......................... 427/38; 427/99;
427/124; 427/250; 427/255; 427/255.1;
427/294
[58] Field of Search .............. 427/38, 99, 174, 294,
427/250, 255, 255.1; 437/245, 930

[56] References Cited

U.S. PATENT DOCUMENTS 4,634,600 1/1987 Shimizu et al. ............... 427/38
4,683,149 7/1987 Suzuki ............................. 427/38

OTHER PUBLICATIONS

Yamada, Takaoka, Usui & Takagi, "Low Temperature Epitaxy by Ionized Cluster Beam", in the Journal of Vacuum Science & Technology A, pp. 722–727.

Primary Examiner—Bernard Fianalto
Attorney, Agent, or Firm—Finnegan, Henderson, Farabow, Garrett & Dunner

[57] ABSTRACT

A method for depositing a thin aluminum film in a vacuum on a surface of a substrate which comprises the steps of:

(a) Irradiating the surface of the substrate with a beam of ions of an inert gas, having a kinetic energy ranging from 100 eV to 1,000 eV at an angle of incidence ranging from about 0° to 60° to a normal of the surface.

(b) Depositing vaporized aluminum on the surface of the substrate, in which the ratio of the amount of ions irradiating the surface to the amount of vapor deposited on the surface ranges from about 0.5% to 30% and wherein the temperature of the substrate ranges from about room temperature to 300° C.

8 Claims, 3 Drawing Sheets

METHOD OF FORMING A THIN ALUMINUM FILM

FIELD OF THE INVENTION

This invention relates to a method of making a thin aluminum film having good crystalline properties and, particularly to a method for depositing a thin aluminum film on a substrate by vapor deposition.

BACKGROUND OF THE INVENTION

In semiconductor integrated circuits, a thin aluminum film or layer is frequently used as a wiring material for electrically connecting unit elements. This is because aluminum is relatively inexpensive, electrically conductive, and capable of being vapor deposited. Furthermore, aluminum has relatively high resistance to corrosion. A thin aluminum film is frequently formed not only for semiconductors but also as based plates for dielectrics.

Vacuum vapor deposition has hitherto been employed for forming a thin aluminum film on a semiconductor base plate or an insulator base plate.

Typically, a base plate is heated to a proper temperature in a vessel kept at reduced pressure of from about $10^{-6}$ to $10^{-5}$ Torr and an aluminum material is melted by heating to evaporate it in the vessel. The aluminum material is usually heated by an electron beam or with resistance heating, such as an electric heater. When the vapor of aluminum is brought into contact with the base plate, the aluminum vapor is cooled and solidified to form a thin film thereon. The thin film formed is polycrystalline aluminum.

Thin aluminum films formed by such a conventional vapor deposition method have exhibited problems with respect to their crystalline properties. The term "crystalline properties" refers to the size of crystal grains, the state of grain boundary, the direction of the crystal, intermixing of impurites, in particular, oxygen, flatness of the film and the like.

An aluminum film formed by a conventional vapor deposition method is mechanically and chemically unstable and it sometimes happens that such a aluminum thin film cannot endure severe operating conditions. For example, when the aluminum is used as wiring and an electric current is passed through, it often happens that the atoms in the unstable aluminum film structure become transferred. This may cause a local increase in electrical resistance or breakage of wiring. This phenomenon is called electromigration and is a well known problem in the wiring patterns of silicon semiconductors.

Furthermore, after forming an aluminum wiring pattern on a silicon semiconductor base plate, if the whole base plate is heated the aluminum wiring may buckle. This phenomenon, known as hillock, may cause electrical connection of adjacent wirings. In other words, there is a possibility of insulation breakage between adjacent wirings by the occurrence of hillock.

The phenomena described above occur because the vapor deposited film is physically and chemically unstable. The reasons being that the vapor deposited layer is polycrystalline, the grain boundary thereof is unstable and likely to move, and the grain size is small.

In an effort to overcome these difficulties, an experiment of adding impurities to aluminum has been performed. It was thought that by adding impurities to aluminum, the physical stability of the aluminum film could be improved. Other efforts included the use of a silicide, which is an alloy of silicon and metal(s), as wiring material.

In all of these methods, however, the wiring resistance becomes greater than the conventional thin aluminum film. Thus, the employment of the aforementioned materials is not preferred for integrated circuits where miniaturization is an important objective. Also, since the width of wiring tends to become increasingly narrower, the specific resistance of the wiring material must be as low as possible.

The most desirable material for wiring material when considering specific resistance, cost, etc., is aluminum. Since a thin aluminum is used for many purposes in addition to the wiring material, a technique capable of strongly attaching aluminum onto an optional base plate has been strongly desired.

In view of this, annealing the thin aluminum film by maintaining the base plate coated with the aluminum film at high temperature after forming the film by vapor deposition was considered. However, in some cases, a base plate cannot itself endure high temperature. Also, even if a base plate could endure the high temperature, an electron device formed on the base plate is frequently deteriorated by the heat. For this reason, annealing a thin aluminum film at high temperatures is usually undesirable.

Therefore, it has been desired to form a thin strong aluminum film on a base plate in a low temperature state. The applicant has manufactured an apparatus for forming a thin film by simultaneously performing ion irradiation of vapor deposited material. The apparatus is a vacuum apparatus comprising a vapor deposition apparatus and an ion striking device.

In this apparatus, the component of an ion beam and the component of a material for vapor deposition are simultaneously directed to a base plate to form a thin film of a compound containing both of the components.

Examples of suitable ions for the ion beam include $N^+$, $C^+$, $Ar^+$ and the like. Also, as a material for vapor deposition, Ti, Si, B, Al and the like may be used.

Thus, by simultaneously performing the ion irradiation and the vapor deposition, a thin film of, for example, TiN, BN, AlN and the like is formed. As the evaporating material, a metal is frequently used. For example, when Fe or Mo is used as the evaporating material, $N^+$ is used as the ion and a thin film of $Fe_xN$ or MoN is formed. Regarding the $Fe_xN$ compound, x can be a plurality of Fe atoms having various valences.

These thin films formed are physically and chemically stable thin compound films. For use on a base plate, a metal or an alloy is frequently used.

Apparatus for forming the ion vapor deposition thin film is known and is explained by referring to FIG. 1. FIG. 1 is a schematic sectional view showing the ion vapor deposition thin film forming apparatus.

An ion vapor deposition chamber 1 is a space capable of being evacuated, equipped with a vapor deposition system Λ and an ion irradiation system Φ. In this apparatus, a vapor evaporation method for ion evaporation is not employed but rather a method of ion irradiation and vapor deposition.

At one side of the ion evaporation chamber is formed a preliminary chamber 2 which is a space for mounting and dismounting a specimen. The preliminary chamber 2 can be partitioned from the ion vapor deposition chamber 1 by a gate valve 3.

Under the ion vapor deposition chamber 1 is disposed a vapor deposition system A comprising an evaporation source 4, an evaporation source container 5, a vapor shutter 6 and a shutter axis 7. As the evaporation source 4, any ordinary evaporation material can be used such as Ti, Si, B or other various metals.

The heating method for the evaporation source and a vessel 5 differ according to the nature of the evaporation material. A resistance heating method or an electron beam heating method can be used. In the case of resistance heating, the evaporation source vessel 5 forms a heater composed of Ta, Mo, W or the like. Also, in the case of electron beam heating, the evaporation source vessel 5 is a crucible. In this apparatus, however an electron beam generating device and a magnet for bending and directing the electron beam to the evaporation source 4 are additionally required. However, they are omitted in FIG. 1 to simplifying the explanation.

Diagonally above the ion vapor deposition chamber 1 a specimen system is disposed. A specimen 9 is fixed to a holder 8 in such a manner that the surface thereof is directed diagonally downward. The holder 8 is supported by a specimen axis 10 which can be rotated and also can move in the axis direction. Thus, at the vapor deposition step, the specimen axis van be rotated to improve the uniformity of the film formation.

Also, in the case of mounting or dismounting the specimen 9, the specimen axis 10 is moved backward and the gate valve 3 is closed. Thus, the preliminary chamber 2 is isolated from the ion vapor deposition chamber 1. In this way, the ion vapor deposition chamber 1 can keep its vacuum state. Thereafter, the wall of the preliminary chamber 2 is pivoted around an opening and closing axis 11, whereby the holder 8 and the specimen 9 can be released outside the apparatus.

Furthermore, the specimen system is equipped with a specimen shutter 12 and a specimen shutter axis 13. The specimen shutter 12 is necessary for directing the ion stream and the stream of the evaporated material to the specimen 9 or shutting these streams off from the specimen 9. Also, a film thickness monitor 18 is disposed near the specimen 9.

The ion vapor deposition chamber 1 is connected to an evacuation system 14, whereby the inside of the ion vapor deposition chamber can be evacuated. An evacuation device may be independently equipped to the preliminary chamber 2.

Regarding the ion irradiation system, diagonally under the ion vapor deposition chamber 1 a bucket type ion source 19 is disposed which comprises screen-type electrodes 20, 21, 22, an ion generating chamber 30, and a power source. In the ion generating chamber 30 is disposed a plurality of filaments 32 through which electric current is supplied by a filament power source 23.

A gas as an ion source is introduced into the ion generating chamber 30 through a valve 28 and a gas stream inlet 29 from a gas bomb 27. By an arc electric power source 24 and the filament power source 23, arc discharging occurs in the inside of the ion generating chamber 30. Many heated electrons are emitted from the filaments 32 which fly towards an anode, and which collide with the gas in the ion generating chamber 30 to energize the gas molecules to an excited state. Thus, a portion of the gas molecules becomes ionized due to the breaking the chemical bonds.

For example, when forming $N^+$ ions, ammonia gas ($NH_3$ gas) is introduced into the ion generating chamber 30. Likewise, when forming $C^+$ ions, methane gas ($CH_4$ gas) is introduced into the chamber. When an ion is originally obtained as simple substance, the gas of the atom for the ion is introduced into the chamber. For example, $O_2$ or an inert gas such as Ne, Ar, He or the like is simply introduced into the chamber as the gas thereof. However, since it is less desirable to form a compound of an inert gas, they are rarely introduced into the chamber.

The ions formed by the collision of electrons fill the ion generating chamber 30 and can be withdrawn from he chamber 30 by a drawing out electrode 25. The speed of the ions is reduced to a proper speed by a speed reducing power source 26 and electrodes 20 and 21. The ions which pass through the electrodes 20 to 22 fly towards the specimen 9 in an almost parallel ion stream.

In the bucket type ion source 19, there are shown gaps in the walls thereof, which means that each wall is electrically insulated from the other. However, these gap portions are airtightly formed so that the ion vapor deposition chamber can be evacuated without any difficulty.

The drawing out power source 25 is connected to the arc electric source 24 by a resistance 31 so that the levels of the arc electric source 24 and the filament power source 23 are not raised.

The accelerating voltage of the ion beam is from 10 KV to 40 KV so that the ions attain a high stream speed having a kinetic energy of from 10 KeV to 40 KeV. The ion irradiation and the vapor deposition are carried out in a vacuum ranging from about $10^{-6}$ to about $10^{-4}$ Torr. The ion electric current is from about several mA to about 10 mA. Also, the beam size is from 30 mm to 150 mm. The beam size can be optionally selected by electrodes 20 to 22.

The power of the evaporation source depends upon the nature of the vapor evaporation material and can range from about 2 KV to 10 KV.

The above-described apparatus is the general feature of the ion vapor deposition thin film forming apparatus previously manufactured by the applicant.

Turning to its operation, the specimen axis is pulled up, the gate valve 3 is closed and the cover is opened. Then, the specimen 9 is mounted on the holder 8. The specimen may be selected from metals, dielectrics, semiconductor base plates and the like.

For example, for making TiN coating, $N_2$ gas or $NH_3$ gas is introduced into the ion generating chamber to generate $N^+$ ion and Ti is sputtered from the evaporation source of Ti. Also, for making a MoN coating, the $N^+$ ion irradiation and the vapor deposition of Mo are simultaneously carried out. The coatings of $Fe_xN$, AlN, BN or the like can be formed in the same manner. In any event irradiation of $N^+$ ion and the vapor deposition of Fe, Al, B and the like, form strong coatings of $Fe_xN$, AlN, and BN.

This ion vapor deposition thin film forming method has the following benefits:

(i) New material can be formed

Since the aforementioned apparatus has excellent controlling faculty, the ion irradiation and the vapor deposition can be separately applied. Also, in the apparatus, each element van be optionally selected and various kinds of ions and vapor evaporating materials can be simultaneously or alternately applied to the surface of a specimen. Thus, a thin film of a new material can be formed on a specimen;

(ii) A thin film having excellent adhesion can be formed

Since in the aforementioned apparatus, the ion irradiation is applied onto a specimen by ions having a high energy ranging from about 10 KeV to 40 KeV, the ion itself and a vapor evaporation element become imbedded into a base plate specimen. The high-speed ions destroy a part of the structure of the base plate to form a transitional layer composed of the element of the base plate, ions and the element of the vapor deposited material. The layer is called a mixing layer. On the mixing layer, a thin compound layer comprising the ion and the element of the vapor deposited material is formed. Due to formation of the thin compound layer on the mixing layer, a strong thin film having excellent adhesion with the base plate is formed. This is the overall effect obtained when the kinetic energy of the ion ranges from about 10 KeV to 40 KeV. This is quite different from a simple vapor deposition method wherein the surface of the base plate is not changed and a polycrystalline layer of the vapor deposited element is merely formed thereon;

(iii) Since the ion bean has a large cross-sectional area, a uniform film can be formed.

This apparatus employs a bucket type ion source, multi filaments and multi electrodes (multi apertured). Thus, even with an ion bean having a large sectional area, the uniformity of the thin film formed is with ±15%.

SUMMARY OF THE INVENTION

A primary object of this invention is to provide a method of forming a stable thin aluminum film which does not undergo electron migration when the thin film is used as wiring within a semiconductor base plate and an electric current is passed therethrough.

As previously discussed, the aforementioned conventional ion vapor deposition method forms a strong thin film of a compound AB, wherein A represents an ion atom and B represents a vapor deposition atom. The formation of such a compound is based on the condition that the atom A and the atom B are atoms capable of forming a compound. It is additionally required that the ion attain a high kinetic energy ranging from about 10 KeV to 40 KeV. For example, when the kinetic energy of N, having a mass number of 14, is 10 KeV the speed thereof becomes 370 Km/sec. Since the ions have such a high kinetic energy, a mixing layer is formed and compound AB is formed in a stable state.

Attempting to improve the crystalline properties of the vapor deposited film of aluminum, inventors used the aforesaid apparatus in a different manner. That is, the investigation is for vapor depositing aluminum but not for forming a compound of aluminum. In furtherance of this, a material having poor reactivity was selected as the ion. However, it has been found that the selection of a poor reactive material only, proved unsatisfactory. That is because if the energy for striking the ion is high, even an atom having poor reactivity becomes embedded in the thin film of aluminum and cannot diffuse out.

If the temperature is sufficiently high, the atoms may completely diffuse out of the thin film since atoms having poor reactivity cause elastic collision. However, as described hereinbefore, it is important to not increase the temperature of specimen to a degree where the electronic device becomes deteriorated.

As a result of these considerations and investigations, the inventors have discovered that a vapor-deposited thin aluminum film can be strongly formed if it is irradiated by ions of an inert gas at a low energy. Advantageously, the crystalline properties of the aluminum film are enhanced, which can be attributed to the increase in the crystal grain size and the uniform arrangement of the crystal orientations.

Furthermore, it has been found that the optimum kinetic energy of inert gas ions is from 100 eV to 1,000 eV which is from 1/10 to 1/400 of the 10 KeV to 40 KeV used in the conventional ion vapor deposition method. It is important in the practice of the present invention that the kinetic energy of the ions is this low.

In the present invention, an inert gas such as Ne, Ar, or He can be used. Furthermore, aluminum itself can be also used as the ion. When the aluminum ion is used, the aluminum film advantageously contains no foreign elements.

The angle of incidence of the ions striking the specimen, or substrate on which the thin aluminum fluid is deposited is from 0° to 60° relative to the normal on the surface of the substrate.

According to the method of the present invention, a strong thin aluminum film is obtained when the temperature of the specimen ranges from room temperature to 300° C. A temperature of 300° C. is a sufficiently low temperature at which the electronic device is not deteriorated.

Thus, the method of the present invention comprises the steps of:

(a) irradiating the surface of the substrate with a beam of ions of an inert gas or aluminum, having a kinetic energy ranging from 100 eV to 1,000 eV at an angle of incidence ranging from about 0° to 60° to a normal of the surface; and (b) depositing vaporized aluminum on the surface of the substrate, in which the ratio of the amount of ions irradiating the surface to the amount of vapor deposited on the surface ranges from about 0.005 to 0.3 and wherein the temperature of the substrate ranges from about room temperature to 300° C.

Advantageously, when aluminum is vapor deposited in accordance with the method of the present invention, electron migration is not likely to occur because the crystal grains have become large and physically stable. The electron migration will be further described hereinbelow.

DETAILED DESCRIPTION OF THE INVENTION

Figure 1:
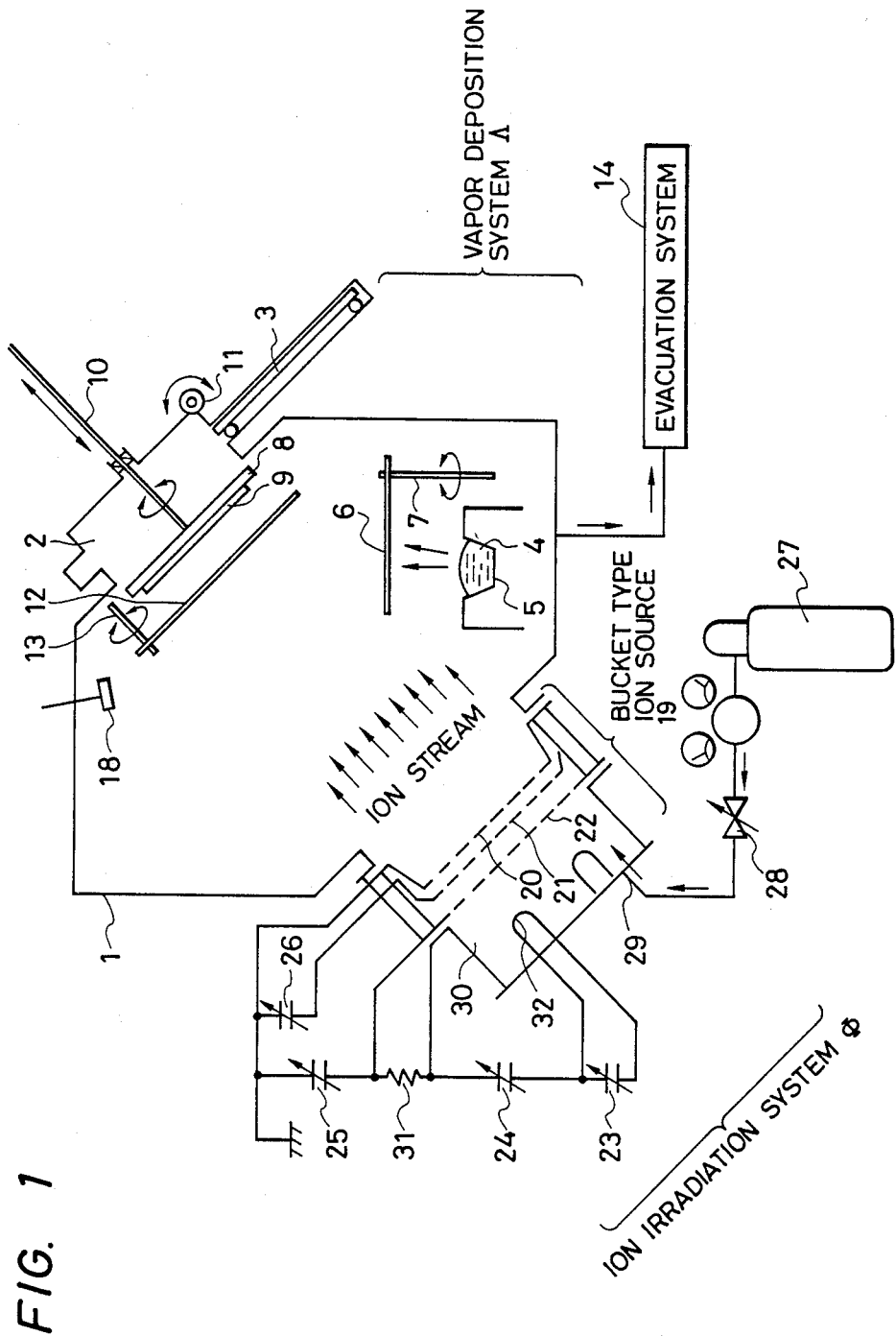
FIG. 1 is a schematic sectional view showing the ion vapor deposition thin film forming apparatus previously developed by the same applicant. The apparatus is known and capable of being employed for practicing the method of this invention.

The present invention is described in greater detail below.

First, the ion energy Ei in this invention is from 100 eV to 1,000 eV. If a monovalent ion having a mass of m is accelerated at V volts and the initial speed is 0, there is a relation of $$Ei = \frac{1}{2} mv^2 = eV \tag{1}$$

wherein $v$ is the final speed. If the mass number of the ion is M, then $$v = \sqrt{\frac{2eV}{M \cdot m_0}} \tag{2}$$

$$v = 13.8 \times \sqrt{\frac{V}{M}} \text{ Km/sec.} \tag{3}$$

wherein $m_0 = 1.66 \times 10^{-27}$Kg, which is the mass of one atomic weight. Also, $e = 1.6 \times 10^{19}$C.

Since the mass numbers of Ne, Ar and He are 20.2, 40.4, and 4.0, respectively, their speeds corresponding to the accelerating voltages V equaling 100V and 1,000V are as follows:

|    | 100 V        | 1,000 V      |
|----|--------------|--------------|
| Ne | 30.7 Km/sec. | 97 Kg/sec.   |
| Ar | 21.8 Km/sec. | 69 Km/sec.   |
| He | 69 Kg/sec.   | 218 Km/sec.  |

These speeds are slow speeds.

Also, since the mass number of aluminum (Al) is 27, the speeds of Al are as follows:

|    | 100 V        | 1,000 V      |
|----|--------------|--------------|
| Al | 26.6 Km/sec. | 84.0 Km/sec. |

This speed is also slow speed.

If the acceleration voltage is higher than 1,000V, these ions enter the thin aluminum film, (i.e., the atom of an inert gas enters deeply into the thin aluminum film and remains therein) whereby the electric conductivity of aluminum is lowered and the aluminum film becomes deteriorated and unsuitable as wiring material.

If the acceleration voltage is lower than 100V, the effect of improving the crystalline properties of the aluminum vapor deposited film is not obtained.

Next, the ratio Y of the flux Q of the ion stream to the flux W of the evaporated component is explained. The ratio Y is defined as follows;

$$Y = \frac{Q}{W} \tag{4}$$

The aforesaid condition (b) requires $0.005 \leq Y \leq 0.3$.

If the density of solid aluminum is p, the rate of vapor deposition is v, the Avogadro's number is Lo, and the mass number of Al is Mo, the flux W of the evaporated component is shown as follows:

$$W = \frac{\rho v L_o}{M_o} \tag{5}$$

Also, if the ion electric current is I, the charge of the ion is q, and the cross sectional area of the ion stream is S, the flux Q of the ion stream is shown as follows:

$$Q = \frac{I}{qS} \tag{6}$$

Thus, the ratio Y becomes as follows:

$$Y = \frac{I}{V} \left( \frac{M_o}{q \rho L_o S} \right) \tag{7}$$

If the ion is a monovalent ion, the charge q of the ion is shown by $q = 1.5 \times 10^{19}$C. Thus, if the values; $\rho = 2.7$ g/cm$^3$, $L_o = 6.02 \times 10^{23}$, and $M_o = 27.0$ are inserted together with the aforesaid value of q, then $$Y = 1.04 \times 10^{-4} \frac{I}{vS} \tag{8}$$

If, for example I is 4 mA, v is 5 Å/sec., and S is 30 cm$^2$, then
ti $Y = 0.28 - 28\%$ (9)

Thus, the condition (b) becomes, in conclusion, as follows:

$$48 \leq \frac{I}{vS} \leq 2880 \ (C/cm^3) \tag{10}$$

If the ratio Y is less than 0.005, i.e., 0.5%, the ion beam is too small and the crystal properties are not improved. In the other hand, if the ratio Y is more than 0.3, i.e., 30%, there is a possibility that the ion of an inert gas will remain in the thin aluminum film. According to this invention $0.5\% \leq Y \leq 30\%$.

The thickness of the thin aluminum film formed by the method of this invention is in the range of from 500 Å to several μm If the thickness is over 10 μm, the film is likely to be separated, and hence, such a thickness is undesirable.

With respect to the electron migration phenomena, when an electric current is passed through an unstable thin aluminum film, an electron migration occurs whereby the thin film is deteriorated and has reduced life.

The mean life of the thin film (MTF) is closely related to its crystalline properties. The crystalline properties of a thin aluminum film can be determined by X-ray diffraction. Since the thin aluminum film is a polycrystalline layer, there are crystal grains of various orientations.

The spacing d of planes having plane indexes of l, m, and n is as follows:

$$d = \frac{1}{\sqrt{l^2 + m^2 + n^2}} \tag{11}$$

Also, if the wavelength of X-ray is Y, the condition of Bragg's diffraction is as follows.

$$2d\sin\theta = \Lambda \tag{12}$$

Thus, the diffraction angle (lmn) to a (lmn) plane is determined. The intensify of diffraction X-ray to the diffraction angle θ(lmn) is shown by I(lmn). If the intensity is large, there are many crystal grains having the (lmn) plane.

Thus, diffraction intensity I(θ) to θ is measured. The correspondence of θ and (lmn) is made by formulae (11) and (12). Thus, I(lmn) can be obtained from the result of X-ray diffraction.

The MTF determined by the deterioration of the aluminum film due to electron migration is evaluated by $$MTF = k \log \frac{I(111)}{I(200)} \quad (13)$$

wherein k is a constant.

That is, if I(111) becomes high, the electron migration is not likely to occur. Thus I(111)/I(200) can be used for the evaluation of the crystal properties. Similarly, if the ratio is large, the electron migration is not likely to occur because the thin layer is physically stable. Usually, the ratio I(111)/I(200) of a thin aluminum film formed by vapor deposition is said to be about 2.

The equation (13) is an empirical equation and is usually accurate for the evaluation of electron migration.

EXAMPLE 1

Aluminum was deposited on a (100) wafer of silicon (Si) at a rate of v=5 Å/sec. by the method of this invention. Aluminum was evaporated by electron beam heating and the wafer was kept at room temperature.

In the ion irradiation system Φ, Ne ions accelerated to 200 eV or 500 eV were generated and the Si wafer was irradiated by the Ne ions. The ions struck the wafer almost vertical to the surface thereof (θ=0). The ion beam current was 0, 1 mA, 4 mA, and 8 mA. The cross sectional area S of the ion beam was 55 cm².

Figure 3:
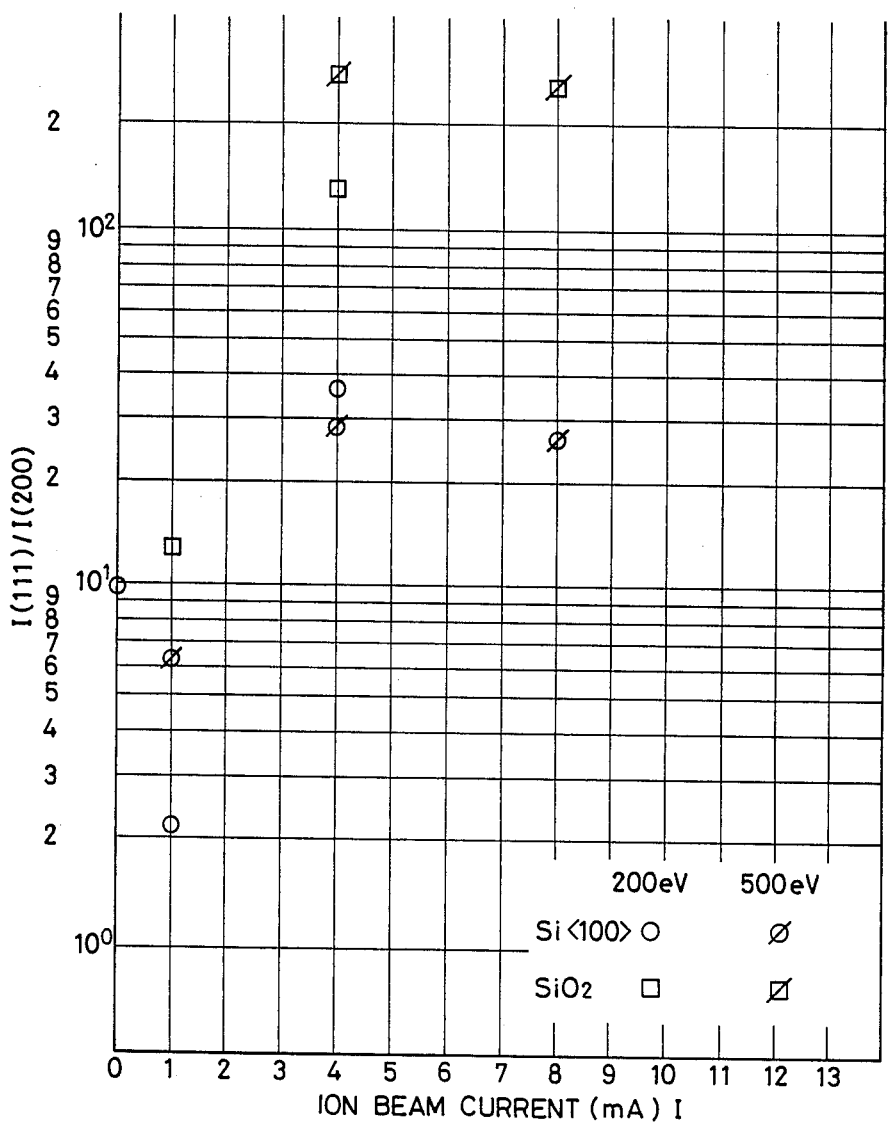
FIG. 3 is a graph showing the change of the crystalline structure of an thin aluminum film produced in accordance with the method of the present invention when the ion beam electric current is varied. The abscissa shows an ion beam electric current while the ordinate is the ration of I(111)/I(200) of X-ray diffraction intensity.

X-ray was applied to each aluminum film formed and the intensity of the diffracted light was measured. Also, the ration of I(111) to I(200) was determined. The results obtained are shown in FIG. 3, wherein the abscissa shows ion beam current I and the ordinate shows the ratio I(111)/I(200).

The data corresponding to the acceleration energy of 200 eV are shown by O and the date corresponding to the acceleration energy of 500 eV are shown by ⌀.

It can be seen that when the ion beam current is increased, the I(111)/I(200) ratio becomes higher than 2.

EXAMPLE 2

A thin aluminum film was formed on a SiO₂ base plate under the same conditions as in Example 1. That is, the vapor deposition rate and the acceleration voltage were the same as those in Example 1 and the ions struck the gas plate vertically. The based plate was kept at room temperature (20° C.).

$$v=5 \text{ Å/sec.}$$

$$Ei=200 \text{ eV, } 500 \text{ eV}$$

$$\theta=0, S=55 \text{ cm}^2$$

$$I=0 \text{ mA, } 1 \text{ mA, } 4 \text{ mA, or } 8 \text{ mA.}$$

Similarly, the structure of each thin aluminum film was determined by X-ray diffraction and the intensity ratio of I(111) to I(200) was determined. The results are shown in FIG. 3.

In the figure, the data corresponding to the acceleration energy of 200 eV are shown by □ and the data corresponding to the acceleration energy of 500 eV are shown by ▨.

I(111)/I(200) is generally larger in an aluminum film formed on SiO₂ than in the aluminum film formed on a Si wafer. Also, the ration is higher than 2 which is a conventional mean value. It can be seen that the thin aluminum films of these examples show a strong resistance to electron migration.

Examples 1 and 2 described-above demonstrate the effect of the ion beam in vertical incidence.

It was observed that when the vapor deposition was performed at room temperature with an acceleration energy of 500 eV and an ion beam of 8 mA, a slight amount of Ne atom remained in the thin aluminum film. The presence of the Ne atom, however, only scarcely increased the electrical resistance of the aluminum film.

However, when the ion beam and the acceleration energy were further increased, the remaining amount of the Ne became unavoidable which, of course, is undesirable. In these examples, an ion beam current of 8 mA, corresponding to Y=0.3, was used. Thus it can be seen that Y must be lower than 0.3.

It should be noted that these results, however, correspond to experiments conducted at room temperature. When the same experiment was performed at a base plate temperature of 300° C., the Ne atom did not remain in the aluminum thin film even when I was 8 mA and Ei was 500 eV.

EXAMPLE 3

The same experiment as above was performed except the angle of incidence was varied. The angle of incidence is the angle formed by the normal to the surface of a base plate and the incident direction of ion beam.

The experiment was carried out for a (100 Si wafer. The conditions were as follows:
Ion: Ne
Ion Current: 4 mA
Ion Heating Energy Ei: 200 eV
Al Vapor Deposition Rate V:5 Å/sec.
Base Plate Temp.: room temperature (20° C.)

Figure 2:
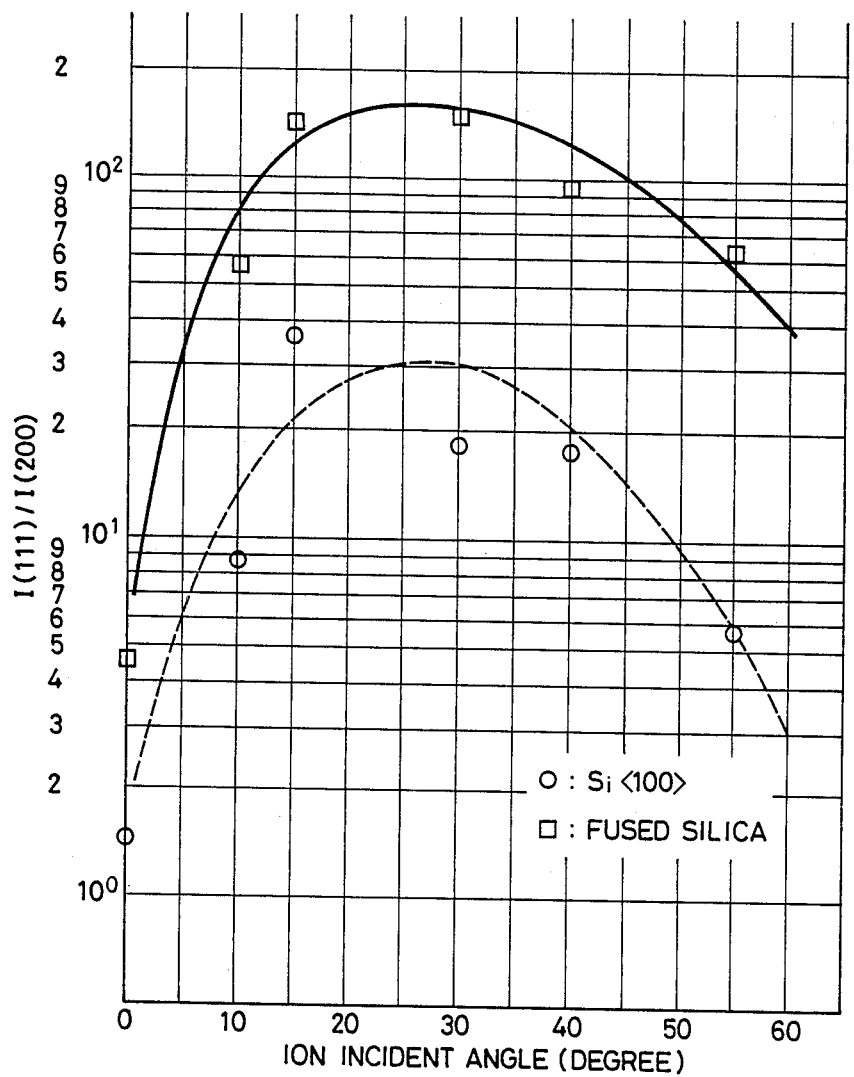
FIG. 2 is a graph showing the change of the crystalline structure of a thin aluminum film produced in accordance with the method of this invention when the angle of incidence of the ion beam is varied. The abscissa shows the angle of incidence and the ordinate is the ratio of I(111)/I(200).

The results obtained are shown in FIG. 2, wherein the abscissa shows the angle of incidence θ and the ordinate shows I(111)/I(200) ratio by X-ray diffraction. The measured results are shown by O.

EXAMPLE 4

The same experiment as above was repeated except SiO₂ was used as the material for the base plate and the angle of incidence θ was varied. The conditions were as follows:
Ion: Ne
Ion Current: 4 mA
Ion Acceleration Energy Ei: 200 eV
Al Vapor Deposition Rate v: 5 Å/sec.
Base Plate Temperature: room temperature (20° C.)

The results obtained are shown in FIG. 2 by □. It can be seen that the vertical incidence (θ=0) is the preferred angle of incidence for Si and SiO₂ base plates. Also preferred is an angle of incidence ranging from about 20° to 30°. In this example, the value of I(111)/I(200) was 10 times higher than the corresponding vertical incidence value. Also, if the angle is from 10° to 40°, a considerably good value of the ratio is obtained. However, it can be seen that in general, if the angle is from 0° to 60°, the desired result is obtained.

Furthermore, the aluminum thin film obtained is better when deposited on $SiO_2$ than on a Si wafer.

As described above, the following benefits were unexpectedly obtained by the method of this invention.

(1) A physically and chemically stable thin aluminum film having improved crystalline properties wherein the intensity I(111) is increased, the crystal grains having the (111)plane on the surfaces are increased, the size of crystal grains having the (111) plane on the surfaces is increased, and the orientations of these crystal grains are uniformly arranged. Since a stable aluminum thin film can be formed at a relatively low temperature, the uses thereof are numerous.

(2) The life determined by the deterioration by an electron migration can be evaluated by I(111)/I(200). Since the ratio becomes high in the method of this invention, the electron migration is not likely to occur thereby rendering an aluminum film suitable as wiring material.

(3) The aluminum film formed contains almost no impurity and hence the resistibility thereof is not increased.

In an attempt to explain the unexpected improvement in the quality of the aluminum film produced from vacuum vapor depositing aluminum while irradiating with inert gas ion or aluminum ion, the following explanations have been preferred:

(1) Adsorbed gases such as $O_2$, $N_2$, $H_2O$ and the like present in the surrounding atmosphere are scattered by the ions to ensure that the surface of specimen is kept clean.

(2) Since the ions collide with the aluminum atoms on the surface of specimen, the atoms become activated into an excited state. Due to this energy interchange, the aluminum atoms become movable on the surface of the specimen and consequently minimize the free energy thereof.

(3) Also due to this energy interchange of the ions on the surface of specimen and the aluminum atoms, the aluminum atoms become energized and become diffusible in the surface of the specimen.

Additional advantages and modifications will readily occur to those skilled in the art. The invention in its broader aspects is, therefore, not limited to the specific details, and illustrative examples shown and described. Accordingly, departures may be made from such details without departing from the spirit or scope of the general inventive concept as defined by the appended claims and their equivalents.

What is claimed is:

1. A method for forming a thin aluminum film in a vacuum on a surface of a substrate comprising the steps of:
   (a) irradiating said surface of said substrate with a beam of ions of an inert gas or aluminum, said beam having an angle of incidence ranging from about 0° to 60° to the normal of said surface, and said ions having a kinetic energy ranging from 100 eV to 1,000 eV; and
   (b) depositing vaporized aluminum on said surface of said substrate while irradiating with said ions, in which the ratio of the amount of ions irradiating said surface to the amount of vapor deposited on said surface ranges from about 0.005 to 0.3, and wherein the temperature of said substrate ranges from about room temperature to 300° C.

2. A method as claimed in claim 1, wherein said inert gas is selected from the group comprising Ne, Ar and He.

3. A method as claimed in claim 1, wherein said ion is aluminum.

4. A method as claimed in claim 1, wherein said substrate is fabricated from a material selected from the group consisting of Si and $SiO_2$.

5. A method as claimed in claim 1, wherein said irradiating and depositing steps are performed simultaneously.

6. A method as claimed in claim 1, wherein said angle of incidence ranges from 20° to 30°.

7. A method as claimed in claim 1, wherein said angle of incidence is 0°.

8. A method as claimed in claim 1, wherein said angle of incidence ranges from 10° to 40°.

* * * * *